US012740496B2

(12) United States Patent
Takano

(10) Patent No.: US 12,740,496 B2
(45) Date of Patent: Sep. 15, 2026

(54) SEMICONDUCTOR PACKAGE

(71) Applicant: SEIKO EPSON CORPORATION, Tokyo (JP)

(72) Inventor: Michiyoshi Takano, Okaya (JP)

(73) Assignee: SEIKO EPSON CORPORATION (JP)

( * ) Notice: Subject to any disclaimer, the term of this patent is extended or adjusted under 35 U.S.C. 154(b) by 412 days.

(21) Appl. No.: 18/511,078

(22) Filed: Nov. 16, 2023

(65) Prior Publication Data

US 2024/0170380 A1 May 23, 2024

(30) Foreign Application Priority Data

Nov. 17, 2022 (JP) ................................ 2022-183938

(51) Int. Cl.

*H10W 90/00* (2026.01)
*H10W 70/65* (2026.01)
*H10W 70/69* (2026.01)
*H10W 72/20* (2026.01)

(52) U.S. Cl.

CPC ......... *H10W 90/701* (2026.01); *H10W 70/65* (2026.01); *H10W 70/69* (2026.01); *H10W 72/265* (2026.01); *H10W 72/267* (2026.01); *H10W 90/724* (2026.01)

(58) Field of Classification Search

CPC ... H10W 72/263; H10W 70/60; H10W 70/62; H10W 80/00; H10W 90/701
See application file for complete search history.

(56) References Cited

U.S. PATENT DOCUMENTS

2022/0122908 A1* 4/2022 Kwon ............... H01L 23/49816
2023/0099351 A1* 3/2023 Kwon ................... H01L 25/105 257/784
2023/0132054 A1* 4/2023 Myung ................... H01L 24/14 257/738
2024/0094104 A1* 3/2024 Lin .......................... G01N 3/20

FOREIGN PATENT DOCUMENTS

JP H08-279572 A 10/1996
JP 2021-012967 A 2/2021

* cited by examiner

*Primary Examiner* — Yu-Hsi D Sun
(74) *Attorney, Agent, or Firm* — Harness, Dickey & Pierce, P.L.C.

(57) ABSTRACT

A semiconductor package includes: a silicon interposer; a photosensitive resin disposed at the silicon interposer and including an opening portion; metal wiring disposed at the photosensitive resin and at the silicon interposer in the opening portion; a first bump disposed at the metal wiring in the opening portion; a semiconductor chip disposed above the first bump and including a pad electrically coupled to the first bump; and a second bump disposed at the metal wiring in a region that overlaps the photosensitive resin in a plan view.

9 Claims, 8 Drawing Sheets

SEMICONDUCTOR PACKAGE

The present application is based on, and claims priority from JP Application Serial Number 2022-183938, filed Nov. 17, 2022, the disclosure of which is hereby incorporated by reference herein in its entirety.

BACKGROUND

1. Technical Field

The present disclosure relates to a semiconductor package.

2. Related Art

JP-A-8-279572 discloses a configuration of a semiconductor package in which a semiconductor chip and solder balls are mounted at a mounting surface of a package substrate and that is electrically bonded to a mother substrate via the solder balls. Heat generated by the semiconductor chip is dissipated to the mother substrate disposed at a back surface of the semiconductor chip.

JP-A-2021-12967 also discloses a configuration of a semiconductor package in which a polyimide is disposed at a mother substrate in order to alleviate stress when a package substrate and the mother substrate are bonded to each other via solder balls.

However, in the related art, since the polyimide is disposed at the mother substrate, the heat of the semiconductor chip may be difficult to be dissipated to a mother substrate side, that is, the dissipation may be insufficient.

SUMMARY

A semiconductor package includes: a silicon interposer; a photosensitive resin disposed at the silicon interposer and including an opening portion; metal wiring disposed at the photosensitive resin and at the silicon interposer in the opening portion; a first bump disposed at the metal wiring in the opening portion; a semiconductor chip disposed at the first bump and including a pad electrically coupled to the first bump; and a second bump disposed at the metal wiring in a region that overlaps the photosensitive resin in a plan view.

DESCRIPTION OF EMBODIMENTS

In the following drawings, three axes orthogonal to one another are described as an X-axis, a Y-axis, and a Z-axis.

Further, a direction along the X-axis is an "X direction", a direction along the Y-axis is a "Y direction", a direction along the Z-axis is a "Z direction", a direction of an arrow is a +direction, and a direction opposite to the +direction is a −direction. A +Z direction may be referred to as "upper", an "upper side", or a "front side", a −Z direction may be referred to as "lower", a "lower side", or a "back side", and viewing from the +Z direction and the −Z direction is also referred to as a plan view or planar. Further, a surface on a +side in the Z direction is described as an "upper surface" or a "front surface", and a surface on a −side in the Z direction that is a side opposite thereto is described as a "lower surface" or a "back surface".

First Embodiment

First, a configuration of a semiconductor package 100 according to a first embodiment will be described with reference to FIGS. 1 and 2.

Figure 1:
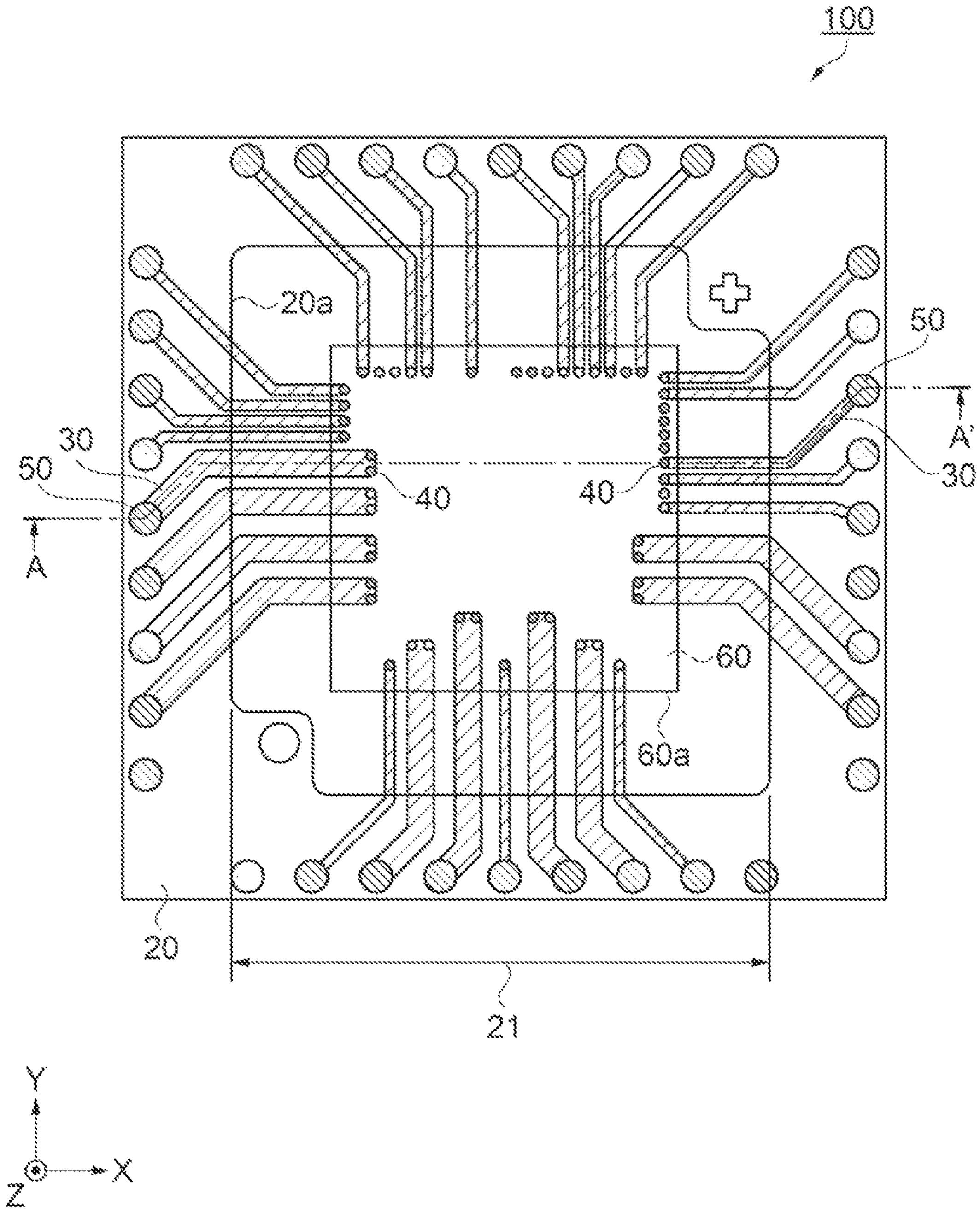
FIG. 1 is a plan view showing a configuration of a semiconductor package according to a first embodiment.
Figure 2:
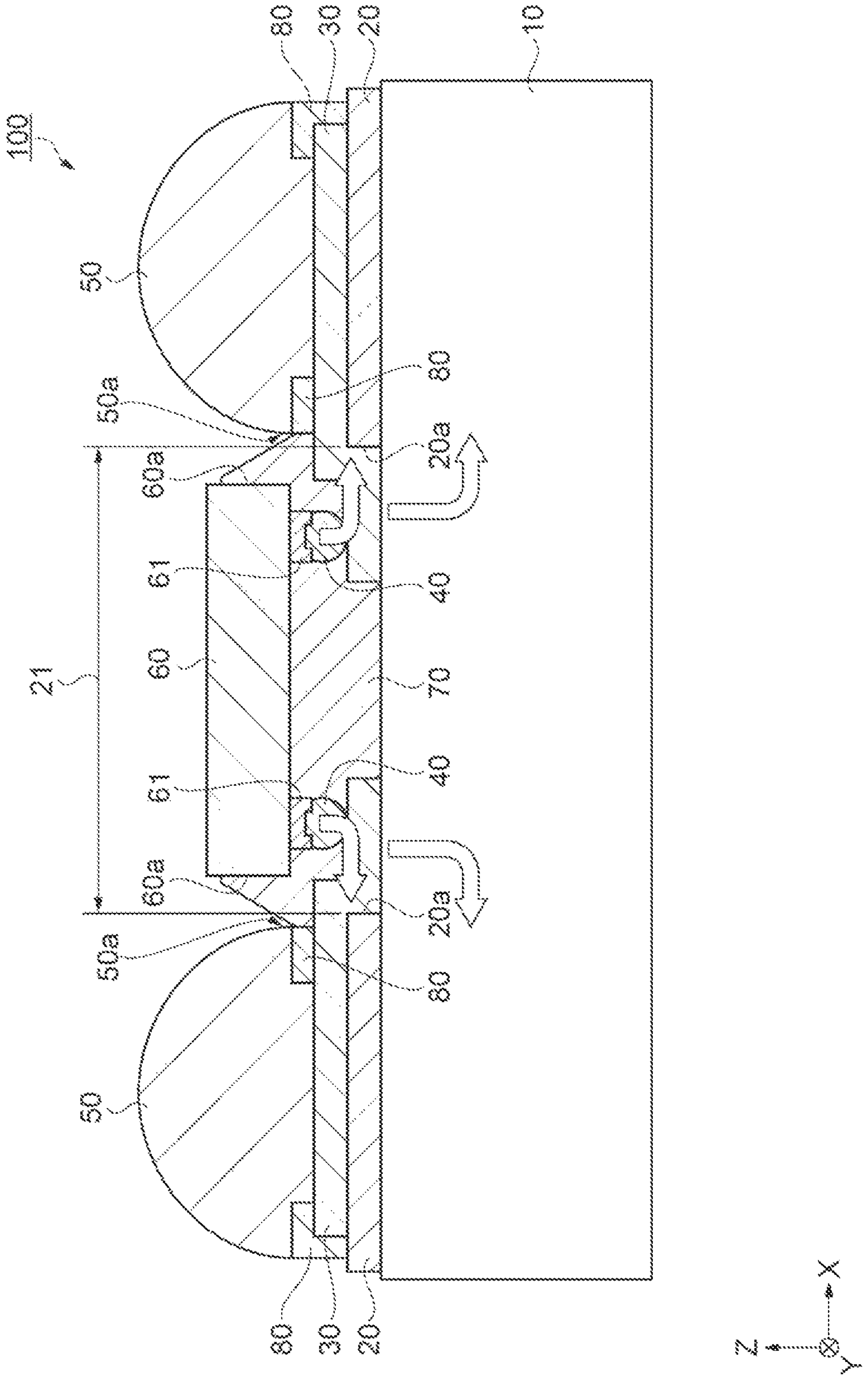
FIG. 2 is a cross-sectional view of the semiconductor package shown in FIG. 1 taken along a line A-A'.

As shown in FIGS. 1 and 2, the semiconductor package 100 includes a silicon interposer 10, a photosensitive resin 20 disposed at the silicon interposer 10, metal wiring 30 disposed at the photosensitive resin 20, first bumps 40 and second bumps 50 disposed at the metal wiring 30, and a semiconductor chip 60 disposed at the first bumps 40.

The silicon interposer 10 is, for example, an interposer obtained by forming a multilayer wiring structure in which each layer includes fine wires at a silicon wafer by using a semiconductor circuit manufacturing technique. The silicon interposer 10 is not limited to silicon, and may be, for example, silicon carbide (SiC) or gallium nitride (GaN).

The photosensitive resin 20 is, for example, a resin material such as a polyimide, and is disposed in an annular shape in a plan view. The photosensitive resin 20 is not limited to the polyimide, and may be, for example, polybenzoxazole (PBO). The photosensitive resin 20 includes an opening portion 21. Specifically, the opening portion 21 is a central portion of the silicon interposer 10, in other words, a lower region where the semiconductor chip 60 is disposed.

The metal wiring 30 is disposed at the photosensitive resin 20 and at the silicon interposer 10 in the opening portion 21. The metal wiring 30 is, for example, copper (Cu). The metal wiring 30 is not limited to Cu, and may be, for example, palladium nickel (Pb/Ni) alloy plating, tin plating (Sn), or solder plating.

The first bump 40 is disposed at the metal wiring 30 in the opening portion 21. The first bump 40 is, for example, solder. The solder is used for bonding metals and the like, and is an alloy containing tin as a main component. The first bump 40 is not limited to tin, and for example, Au (gold) may be used.

The semiconductor chip 60 is disposed at the first bump 40. A pad 61 is disposed between the first bump 40 and the semiconductor chip 60. The pad 61 is, for example, aluminum (Al). As another example of the pad 61, an aluminum alloy-based material (for example, aluminum silicon or aluminum silicon copper) may be used. The semiconductor chip 60 includes an integrated circuit. The integrated circuit and the pad 61 are electrically coupled to each other.

The second bump 50 is disposed at the metal wiring 30 in a region that overlaps the photosensitive resin 20 in a plan view. That is, a plurality of second bumps 50 are disposed in a region that overlaps the photosensitive resin 20 disposed in an annular shape in a plan view. Similar to the first bump 40, the second bump 50 is, for example, solder.

As shown in FIG. 2, an underfill 70 is provided below the semiconductor chip 60. Specifically, the underfill 70 is covered from an outer edge 60*a* of the semiconductor chip 60 over the metal wiring 30 and the silicon interposer 10 in the opening portion 21. The underfill 70 is, for example, an epoxy-based resin. That is, a gap between the semiconductor chip 60 and the silicon interposer 10 is filled with the underfill 70. Accordingly, it is possible to ensure mechanical strength of the semiconductor chip 60, ensure insulation properties of each member, and improve moisture resistance.

As described above, the opening portion 21 is provided in the photosensitive resin 20, and the metal wiring 30 and the silicon interposer 10 are in direct contact with each other in the opening portion 21. Therefore, heat of the semiconductor chip 60 can be transferred to the pads 61, the first bumps 40, the metal wiring 30, and the silicon interposer 10 in this order to be dissipated. That is, since there is no photosensitive resin 20 in the opening portion 21, the heat of the semiconductor chip 60 can be easily dissipated through the opening portion 21 to the silicon interposer 10.

As shown in FIG. 2, at an outer peripheral portion of the second bump 50, an overcoat 80 made of an insulation material is disposed between the second bump 50 and the metal wiring 30 as well as the photosensitive resin 20. The overcoat 80 has, for example, a function of holding a position of the second bump 50 in place, and ensures insulation properties between the overcoat 80 and the metal wiring 30.

As shown in FIGS. 1 and 2, an end portion 20*a* of the opening portion 21 of the photosensitive resin 20 is disposed such that the end portion 20*a* is on an outer side with respect to the outer edge 60*a* of the semiconductor chip 60, and is on an inner side with respect to an edge 50*a* of the second bump 50.

In this way, since the end portion 20*a* of the opening portion 21 is disposed on the outer side with respect to the outer edge 60*a* of the semiconductor chip 60, the heat of the semiconductor chip 60 can be efficiently dissipated through the opening portion 21 below the semiconductor chip 60 to the silicon interposer 10. Further, since the end portion 20*a* is disposed on the inner side with respect to the edge 50*a* of the second bump 50, the entire second bump 50 can overlap the photosensitive resin 20 in a plan view. For example, when the semiconductor package 100 and a mother substrate are bonded to each other, impact and stress received by the second bump 50 can be alleviated by the photosensitive resin 20 in a post-bonding environment.

As described above, the semiconductor package 100 according to the first embodiment includes: the silicon interposer 10; the photosensitive resin 20 disposed at the silicon interposer 10 and including the opening portion 21; the metal wiring 30 disposed at the photosensitive resin 20 and at the silicon interposer 10 in the opening portion 21; the first bump 40 disposed at the metal wiring 30 in the opening portion 21; the semiconductor chip 60 disposed at the first bump 40 and including the pad 61 electrically coupled to the first bump 40; and the second bump 50 disposed at the metal wiring 30 in the region that overlaps the photosensitive resin 20 in a plan view.

According to the configuration, the opening portion 21 is provided in the photosensitive resin 20, and the metal wiring 30 and the silicon interposer 10 are in direct contact with each other in the opening portion 21. Therefore, the heat of the semiconductor chip 60 can be dissipated through the pads 61, the first bumps 40, the metal wiring 30, and the silicon interposer 10. That is, since there is no photosensitive resin 20 having poor thermal conductivity in the opening portion 21, the heat of the semiconductor chip 60 can be easily dissipated through the opening portion 21 to the silicon interposer 10. In other words, the number of heat dissipation paths can be increased.

In the semiconductor package 100 according to the first embodiment, the end portion 20*a* of the photosensitive resin 20 in the opening portion 21 may be on the outer side with respect to the outer edge 60*a* of the semiconductor chip 60 and on the inner side with respect to the edge 50*a* of the second bump 50. According to the configuration, since the end portion 20*a* of the opening portion 21 is disposed on an outer side of the semiconductor chip 60, the heat of the semiconductor chip 60 can be efficiently dissipated through the opening portion 21 below the semiconductor chip 60 to the silicon interposer 10. Further, since the end portion 20*a* is disposed on the inner side with respect to the edge 50*a* of the second bump 50, the entire second bump 50 can overlap the photosensitive resin 20 in a plan view. For example, when the semiconductor package 100 and a mother substrate are bonded to each other, impact and stress received by the second bump 50 can be alleviated by the photosensitive resin 20 in a post-bonding environment.

Second Embodiment

Next, a configuration of a semiconductor package 100A according to a second embodiment will be described with reference to FIGS. 3 and 4.

The semiconductor package 100A according to the second embodiment is different from the configuration of the semiconductor package 100 according to the first embodiment in that dummy bumps 41 are disposed in addition to the first bumps 40. Therefore, for the semiconductor package 100A according to the second embodiment, configurations the same as those of the semiconductor package 100 according to the first embodiment are denoted by the same reference numerals, and detailed description will be omitted.

Figure 3:
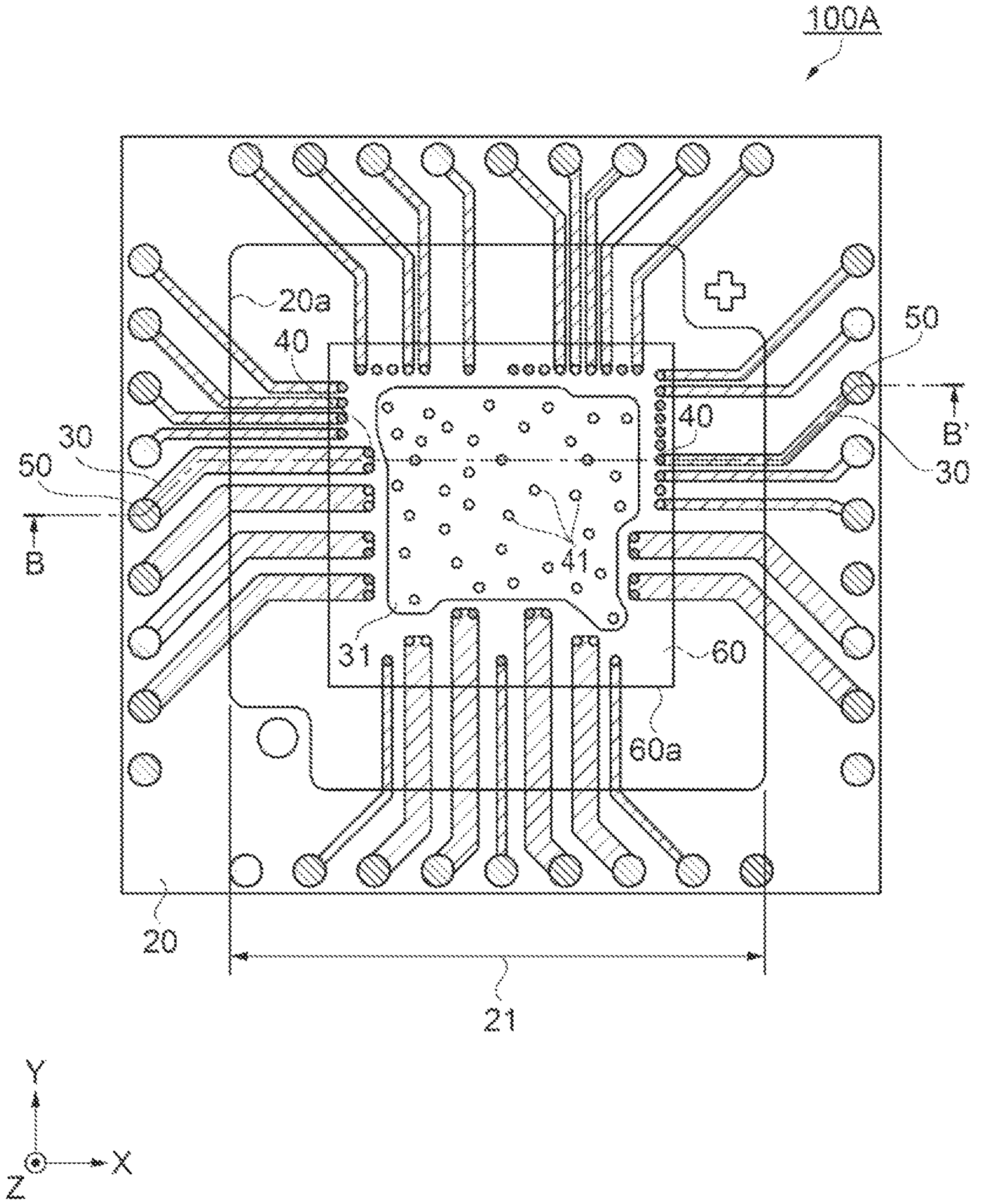
FIG. 3 is a plan view showing a configuration of a semiconductor package according to a second embodiment.
Figure 4:
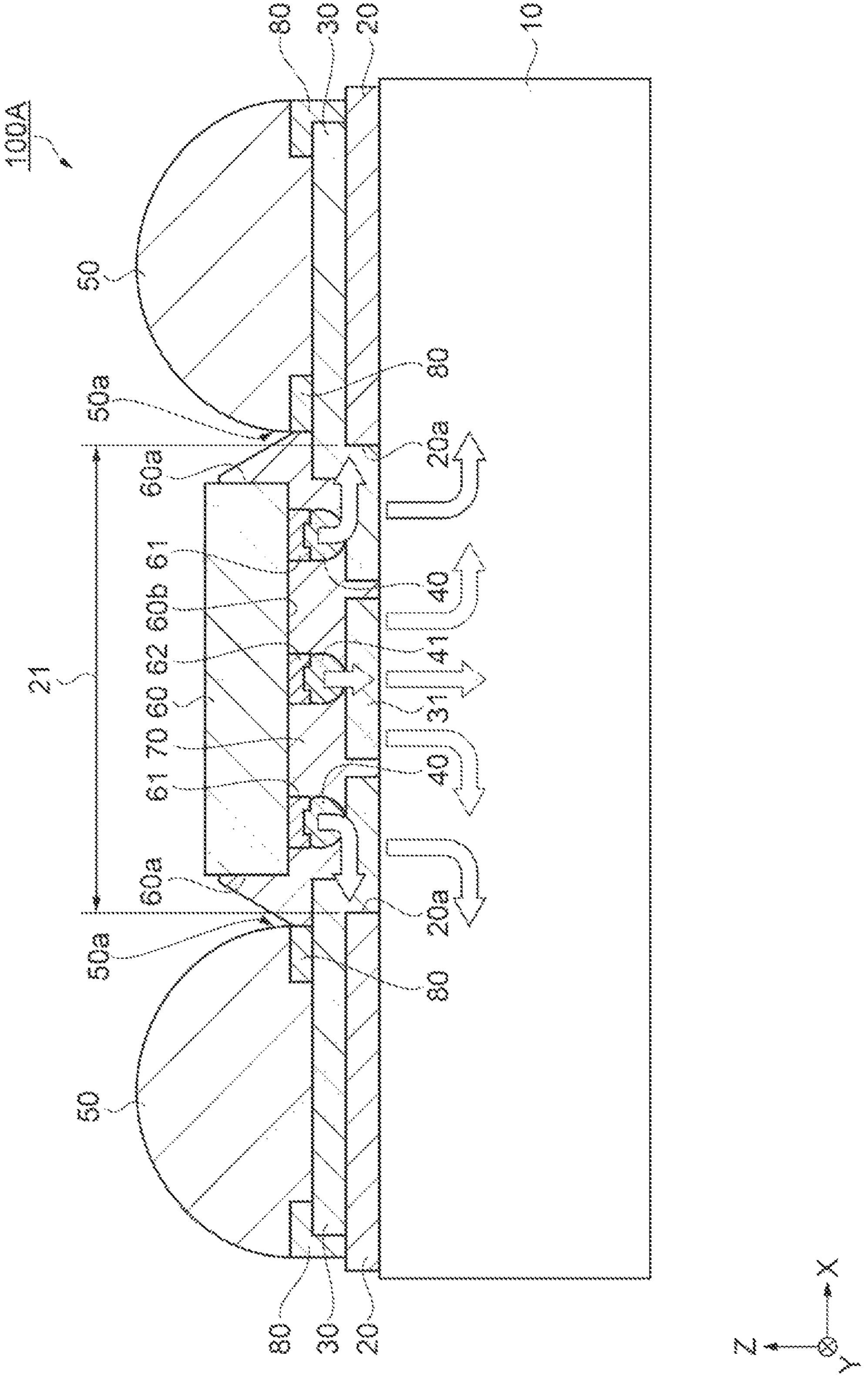
FIG. 4 is a cross-sectional view of the semiconductor package shown in FIG. 3 taken along a line B-B'.

As shown in FIGS. 3 and 4, the semiconductor package 100A according to the second embodiment includes dummy pads 62 disposed apart from the pads 61 on a lower surface 60*b* of the semiconductor chip 60 where the pads 61 are disposed. Further, the semiconductor package 100A includes the dummy bumps 41 coupled to the dummy pads 62, and a dummy metal layer 31 disposed between the dummy bumps 41 and the silicon interposer 10 in a region of the opening portion 21.

Similar to the pad 61, the dummy pad 62 is made of aluminum (Al). As another example of the dummy pad 62, an aluminum alloy-based material (for example, aluminum silicon or aluminum silicon copper) may be used. An integrated circuit of the semiconductor chip 60 and the dummy pad 62 are in an electrically floating state. That is, the integrated circuit of the semiconductor chip 60 and the dummy pad 62 are not electrically coupled.

Similar to the first bump 40, the dummy bump 41 is solder, and is disposed between the dummy metal layer 31 and the dummy pad 62. The dummy metal layer 31 is apart from the metal wiring 30, and is, for example, one metal layer coupled to cover a region where the dummy bumps 41 are disposed.

In this way, since the dummy pads 62, the dummy bumps 41, and the dummy metal layer 31 are disposed between the semiconductor chip 60 and the silicon interposer 10 in the opening portion 21, heat of the semiconductor chip 60 can be efficiently dissipated by the silicon interposer 10 via the dummy pads 62, the dummy bumps 41, and the dummy metal layer 31 in addition to effects of the semiconductor package 100 according to the first embodiment. That is, the number of heat dissipation paths can be increased.

As described above, the semiconductor package 100A according to the second embodiment includes: the dummy pads 62 disposed apart from the pads 61 on the lower surface 60*b* of the semiconductor chip 60 where the pads 61 are disposed; the dummy bumps 41 coupled to the dummy pads 62; and the dummy metal layer 31 disposed between the dummy bumps 41 and the silicon interposer 10 in the region of the opening portion 21.

According to the configuration, since the dummy pads 62, the dummy bumps 41, and the dummy metal layer 31 are disposed between the semiconductor chip 60 and the silicon interposer 10 in the opening portion 21, the heat of the semiconductor chip 60 can be dissipated to the silicon interposer 10 via the dummy pads 62, the dummy bumps 41, and the dummy metal layer 31. That is, the number of heat dissipation paths can be increased by using the dummy bumps 41.

In the semiconductor package 100A according to the second embodiment, the dummy bump 41 may be in an electrically floating state. According to the configuration, since the dummy bump 41 is in a floating state, for example, even if the dummy bump 41 is not used as a circuit, the number of heat dissipation paths can be increased.

Hereinafter, modifications of the embodiments described above will be described.

Figure 5:
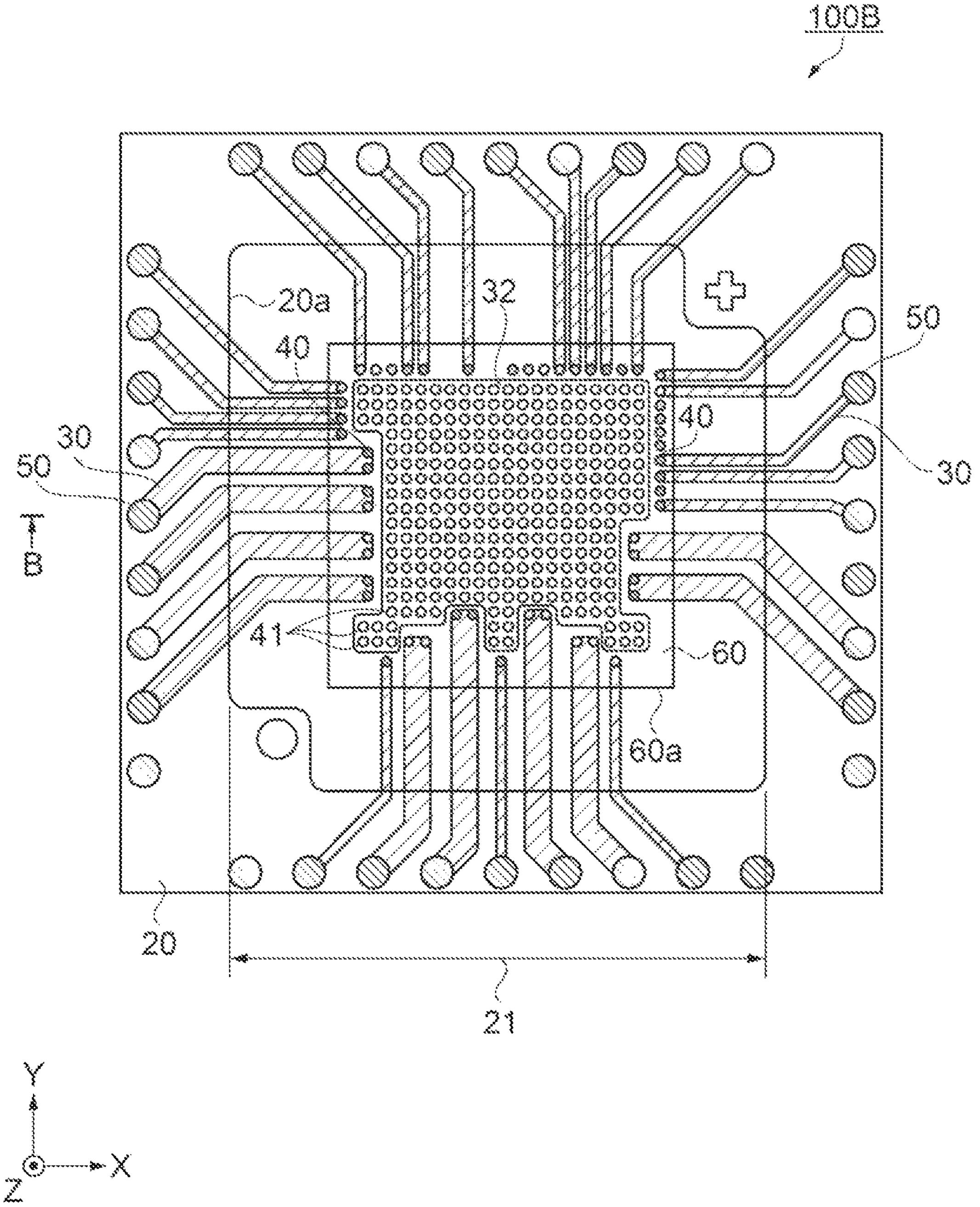
FIG. 5 is a plan view showing a configuration of a semiconductor package according to a modification.

In addition to disposing the dummy bumps 41 as in the semiconductor package 100A according to the second embodiment described above, a configuration as shown in FIG. 5 may be adopted. As shown in FIG. 5, a semiconductor package 100B according to a modification is different from the semiconductor package 100A according to the second embodiment in that a plurality of dummy bumps 41 are arranged and disposed in a lattice pattern at a dummy metal layer 32 in a plan view.

In the semiconductor package 100B, when the plurality of dummy bumps 41 are arranged and disposed in the lattice pattern, the lower surface 60*b* of the semiconductor chip 60 and the dummy bumps 41 can be brought into contact with each other more, and heat of the semiconductor chip 60 can be more efficiently dissipated to the silicon interposer 10.

In this way, in the semiconductor package 100B according to the modification, the dummy bump 41 includes the plurality of dummy bumps 41, and the plurality of dummy bumps 41 may be disposed in the lattice pattern at the dummy metal layer 32. According to the configuration, since the dummy bumps 41 are disposed in the lattice pattern, it is possible to efficiently increase the number of heat dissipation paths from the dummy pads 62 to the dummy bumps 41 and the dummy metal layer 32.

Figure 6:
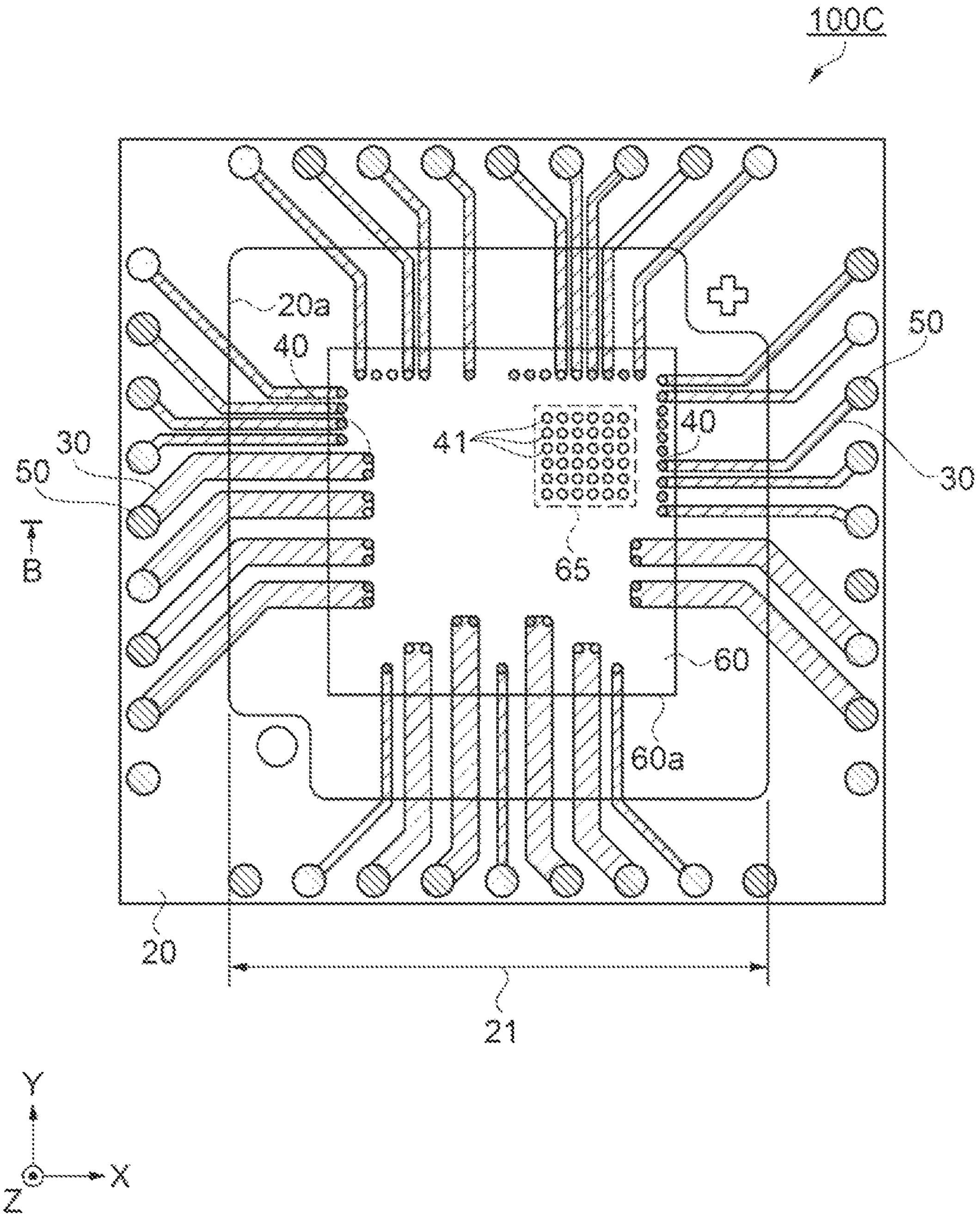
FIG. 6 is a plan view showing a configuration of a semiconductor package according to a modification.

The dummy bumps 41 are not limited to being randomly disposed or disposed in the lattice pattern as described above, and may be configured as shown in FIG. 6. As shown in FIG. 6, a semiconductor package 100C according to a modification is different from the semiconductor packages 100A and 100B in that the dummy bumps 41 are disposed at a high density to overlap a heat-generating body 65 of the semiconductor chip 60 in a plan view.

The heat-generating body 65 of the semiconductor chip 60 is, for example, a MOS transistor, a bipolar transistor, or a resistance element.

In this way, in the semiconductor package 100C according to the modification, the dummy bump 41 includes the plurality of dummy bumps 41, and the dummy bumps 41 may be disposed at a higher density in the region that overlaps the heat-generating body 65 of the semiconductor chip 60 than in a region that does not overlap the heat-generating body 65. According to the configuration, since the dummy bumps 41 are disposed at a high density around the heat-generating body 65 of the semiconductor chip 60, heat of the semiconductor chip 60 can be efficiently dissipated to the silicon interposer 10.

An upper surface of the silicon interposer 10 is not limited to being flat as described above, and as shown in FIG. 7, a configuration may be adopted in which a concave portion 11 is formed in the upper surface and the semiconductor chip 60 is disposed in the concave portion 11.

Figure 7:
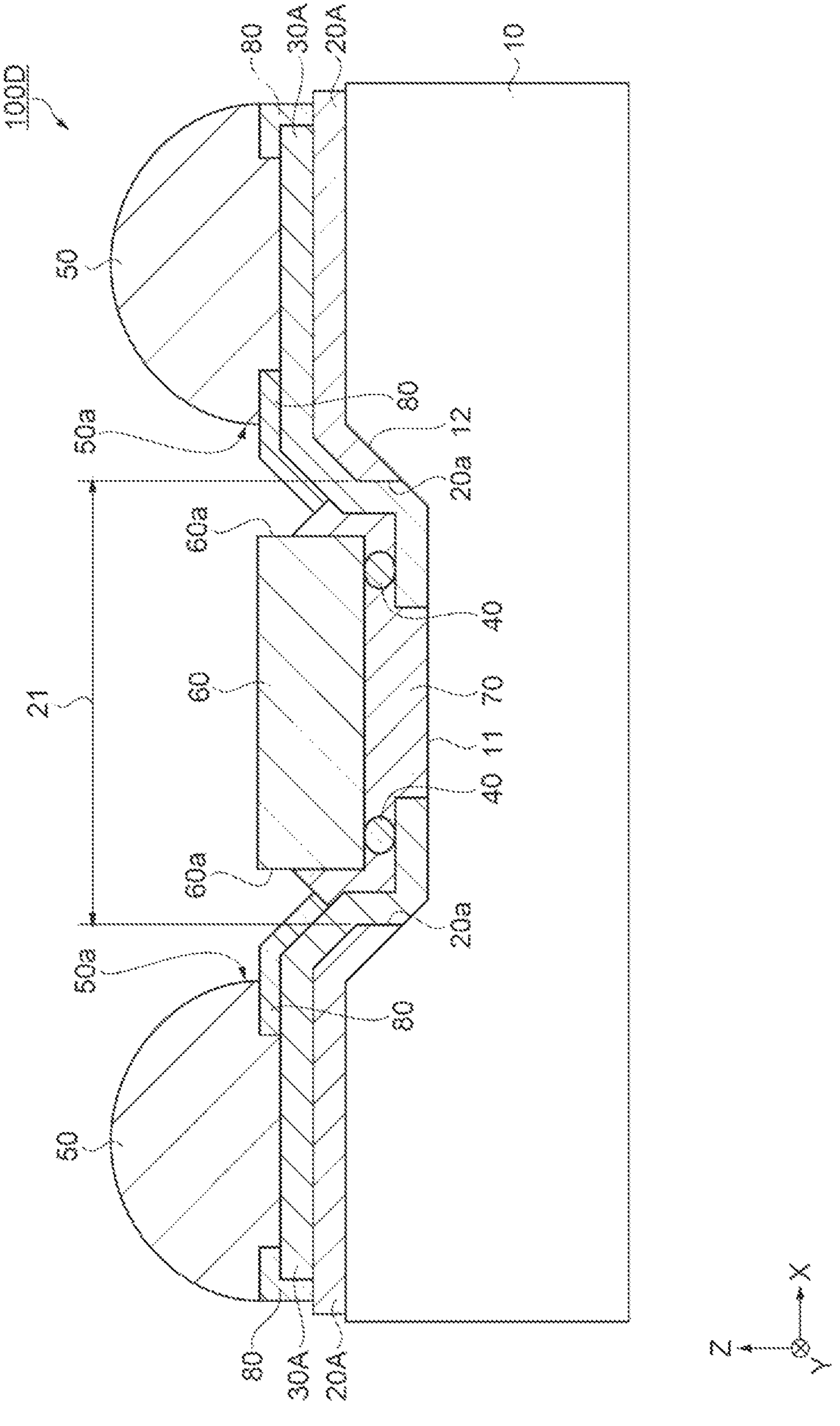
FIG. 7 is a cross-sectional view showing a configuration of a semiconductor package according to a modification.

Specifically, as shown in FIG. 7, in a semiconductor package 100D according to a modification, a photosensitive resin 20A is formed from the upper surface of the silicon interposer 10 to an inclined surface 12 of the concave portion 11. Metal wiring 30A is formed from a region that overlaps the second bump 50 to a region that overlaps the first bump 40. A depth of the concave portion 11 is, for example, about 60 μm to 70 μm.

In this way, it is possible to make a height of an upper surface of the semiconductor chip 60 smaller than a height of an upper surface of the second bump 50 by disposing the semiconductor chip 60 in the concave portion 11. Therefore, for example, even if the lower surface 60*b* of the semiconductor chip 60 cannot be made thin by polishing or the like, or a height of the second bump 50 is lowered, the upper surface of the second bump 50 can be made higher than the upper surface of the semiconductor chip 60, and the second bump 50 and another substrate can be bonded to each other.

Figure 8:
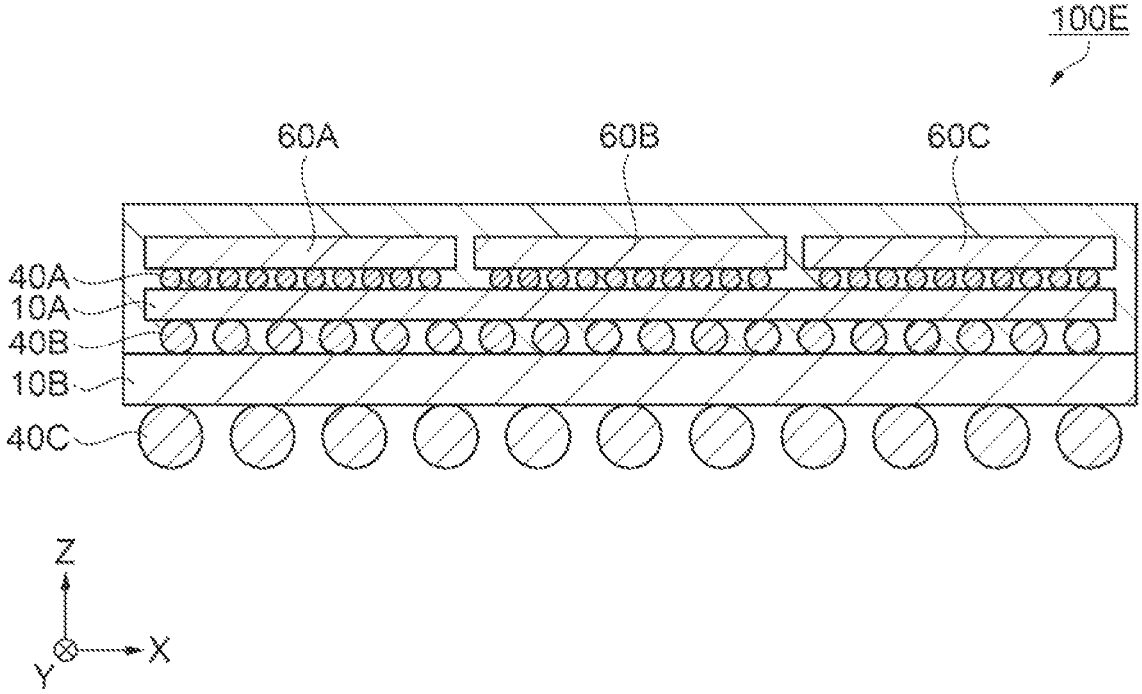
FIG. 8 is a cross-sectional view showing a configuration of a semiconductor package according to a modification.

The present disclosure is not limited to disposing one semiconductor chip 60 at the silicon interposer 10 as described above, and a plurality of semiconductor chips 60 may be disposed as shown in FIG. 8.

Specifically, as shown in FIG. 8, in a semiconductor package 100E according to a modification, first bumps 40A are disposed at a silicon interposer 10A, and the silicon interposer 10A and three semiconductor chips 60A, 60B, and 60C are electrically coupled to each other via the first bumps 40A. Second bumps 40B are disposed below the silicon interposer 10A, and the silicon interposer 10A and a package substrate 10B are electrically coupled to each other via the second bumps 40B. Third bumps 40C are disposed below the package substrate 10B.

Even with such a configuration of the semiconductor package 100E, heat of the semiconductor chips 60A, 60B, and 60C can be dissipated via the silicon interposer 10A.

What is claimed is:

1. A semiconductor package comprising:

a silicon interposer;

a photosensitive resin disposed at the silicon interposer and including a first opening portion;

a metal wiring positioned overtop the photosensitive resin at positions of the photosensitive resin located outside of the first opening portion and positioned overtop the silicon interposer at positions of the silicon interposer located within the first opening portion, the metal layer including a second opening located within the first opening;

a first bump disposed at the metal wiring in the opening portion;

a semiconductor chip disposed at the first bump and including a pad electrically coupled to the first bump; and a second bump disposed at the metal wiring in a region that overlaps the photosensitive resin in a plan view wherein an end portion of the photosensitive resin defining the first opening portion is positioned between an outer edge of the semiconductor chip and a first inner edge of the second bump that faces the first opening portion, and the end portion of the photosensitive resin is positioned outboard from a second inner edge of the metal wiring that defines the second opening portion.

2. The semiconductor package according to claim 1, further comprising:

a dummy pad disposed apart from the pad on a surface of the semiconductor chip where the pad is disposed;

a dummy bump coupled to the dummy pad; and a dummy metal layer disposed between the dummy bump and the silicon interposer in a region of the opening portion.

3. The semiconductor package according to claim 2, wherein the dummy bump is in an electrically floating state.

4. The semiconductor package according to claim 2, wherein the dummy bump includes a plurality of dummy bumps, and the plurality of dummy bumps are disposed in a lattice pattern at the dummy metal layer.

5. The semiconductor package according to claim 2, wherein the dummy bump includes a plurality of dummy bumps, and the plurality of dummy bumps are disposed at a higher density in a region that overlaps a heat-generating body of the semiconductor chip than in a region that does not overlap the heat-generating body.

6. The semiconductor package according to claim 1, wherein the metal wiring is formed directly on the silicon interposer in the first opening portion without interposing the photosensitive resin.

7. The semiconductor package according to claim 1, wherein the metal wiring is continuously formed from above the photosensitive resin to within the first opening portion on the silicon interposer.

8. The semiconductor package according to claim 1, wherein the metal wiring has a first height at a portion formed above the photosensitive resin and a second height, different from the first height, at a portion formed within the first opening portion on the silicon interposer.

9. The semiconductor package according to claim 1, wherein the metal wiring has a step at a position corresponding to an edge of the first opening portion on the silicon interposer.

* * * * *